United States Patent [19]

Eigenbrode

[11] 3,993,390
[45] Nov. 23, 1976

[54] HEADERS WITH INSERTABLE LATCH MEMBERS

[75] Inventor: George Thomas Eigenbrode, Mechanicsburg, Pa.

[73] Assignee: E. I. Du Pont de Nemours and Company, Wilmington, Del.

[22] Filed: Mar. 12, 1975

[21] Appl. No.: 557,578

[52] U.S. Cl. .............................. 339/91 R; 339/17 L
[51] Int. Cl.² ........................................ H01R 13/54
[58] Field of Search .................. 339/17, 75, 91, 176

[56] References Cited
UNITED STATES PATENTS

| | | | |
|---|---|---|---|
| 1,794,777 | 3/1931 | Kliegl | 339/91 R |
| 2,384,267 | 9/1945 | Andersen | 339/91 R |
| 3,394,337 | 7/1968 | Miller | 339/91 R |
| 3,518,620 | 6/1970 | Bushey et al. | 339/17 L |
| 3,740,699 | 6/1973 | Johnson et al. | 339/221 M |
| 3,803,533 | 4/1974 | Taplin | 339/91 R |
| 3,824,522 | 7/1974 | Bertrams et al. | 339/91 R |

FOREIGN PATENTS OR APPLICATIONS

| 922,776 | 2/1947 | France | 339/91 R |
|---|---|---|---|

Primary Examiner—Roy Lake
Assistant Examiner—Neil Abrams

[57] ABSTRACT

A header is provided for mounting on a circuit board comprising a block having a plurality of circuit board pins mounted therein and a generally rectangular unitary housing. The unitary housing and block have a face for mounting on a surface of a circuit board. The face having a cavity at each end of the block for receiving a pair of latch members. Each cavity having a common wall with each end of the block, a recessed surface spaced from the face, and a wall spaced from the common wall having a rectangular channel therein. Also provided is a latch member for insertion in each cavity at each end of the block. Each latch member including a base having a substantially rectangular member protruding from one side of the base, an elongated tapered latch arm extending from the base, a latch surface on the free end of the latch arm, and a latch release extending from the latch opposite the latch surface.

10 Claims, 7 Drawing Figures

HEADERS WITH INSERTABLE LATCH MEMBERS

BACKGROUND OF THE INVENTION

1. Field of the Invention

The present invention relates to electrical connectors, and particularly relates to headers for mounting on circuit boards and releasably securing a connector block and a plurality of electrical connectors therein with a plurality of mating electrical connectors mounted in the header.

2. Description of the Prior Art

Electrical connector blocks, headers, housings and assemblies are well-known in the prior art. Electrical connector blocks suitable for use with the header of the present invention are described in U.S. Pat. Nos. 3,781,760 and 3,820,058. An electrical connector housing having a hood or shroud for receiving a connector block having a plurality of mating electrical connectors is described in U.S. Pat. No. 3,366,729. U.S. Pat. No. 3,368,182 discloses a connector housing including a cylindrical cavity with recesses formed in an interior surface of the cavity and a locking member mounted in each recess. An electrical connector including a base member having elongated latch members is described in U.S. Pat. No. 3,820,055.

The header block and latch members of the present invention are readily distinguished by the cavities in the face of the header at each end of the block and unitary housing, the insertable latch members including a base for mounting in each of the cavities in the face of the header, and the tapered latch arms extending from the base.

SUMMARY OF THE INVENTION

According to the present invention, a header is provided for mounting on a circuit board comprising a block having a plurality of circuit board pins mounted therein and a generally rectangular unitary housing, the unitary housing and block include a face for mounting on a side of the circuit board, the face having a cavity at each end of the block for receiving a pair of latch members, each cavity having a common wall with the end of said block, a recessed surface spaced inwardly from said face, and a wall spaced from and opposite the common wall, the second wall having a rectangular channel extending therein. Preferably, the unitary housing includes a pair of side walls and a top wall opposite said face, each side wall of said cavity being in communication with each cavity in the face and divergent from each other.

Also provided is a latch member for insertion in each cavity at each end of the block comprising a base having a substantially rectangular member extending from one side of the base and an elongated, tapered latch arm extending from the base, the free end of each latch arm having a latch surface on one side thereof, and a latch release member on the opposite side thereof. Preferably, the latch release member extends obliquely from the side of the free end of the latch arm away from the latch surface.

The header and latch members provide for standardization of headers for applications requiring latching and not requiring latching of a connector block by merely inserting or removing the latch member in the cavity at each end of the header before mounting the header on a circuit board. The insertable latch member being separately molded permits for less complicated and more economical mold designs for headers and provides for the use of latching headers as required, thus minimizing inventories of latching and non-latching headers.

DETAILED DESCRIPTION OF A PREFERRED EMBODIMENT

Figure 1:
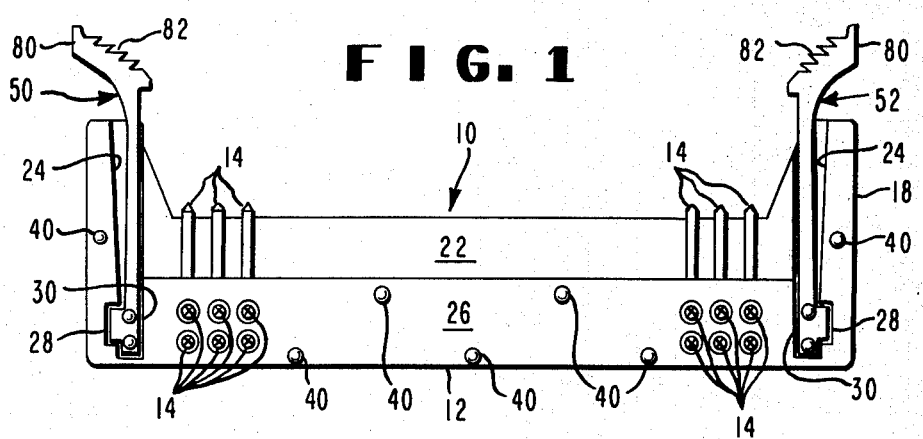
FIG. 1 is a face view of an embodiment of a header and latch member of the invention.
Figure 2:
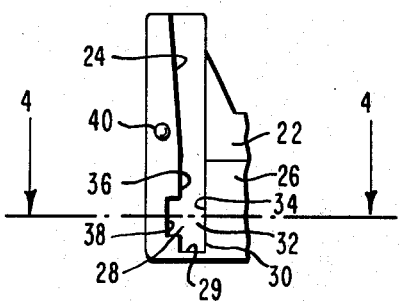
FIG. 2 is a face view broken-away of the header of the invention of FIG. 1.
Figures 3, 4:
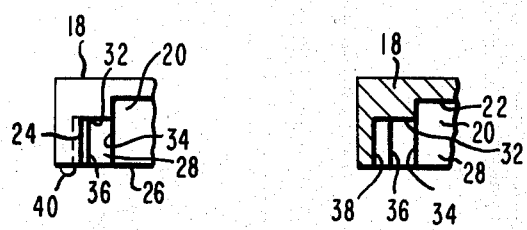
FIG. 3 is a top view broken-away of FIG. 2.
FIG. 4 is a section view taken along line 4—4 of FIG. 3.

A preferred embodiment of the header and latch member of the present invention is described with reference to the attached drawings wherein the same numerals are used throughout the various views to identify the same elements.

With particular reference to FIGS. 1, 2, 3 and 4, a header 10 comprising a block 12 having a plurality of pins 14 mounted therein and a housing 18 unitary with the block 12 is illustrated. The housing 18 has a generally rectangular cavity 20 for receiving a connector block having a plurality of mating electrical connectors mounted therein. The cavity 20 has a top wall 22 and inclined side walls 24. Face 26 of the header 10 has cavities 28 extending into the header 10 at each end 30 of the block 12 for receiving insertable latch members 50 and 52. Each cavity 28 has a recessed surface 32 spaced inwardly from the face 26 of the header 10, a side wall 34 at the end 30 of the block 12, and a sidewall 36 opposite wall 34 having a rectangular channel 38 formed therein. Protuberances 40 on face 26 of header 10 are provided for engaging a surface of a circuit board on which the header 10 is to be mounted.

Figure 5:
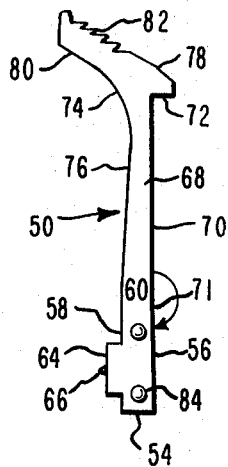
FIG. 5 is a detailed view of an embodiment of a latch member according to the invention.
Figure 6:
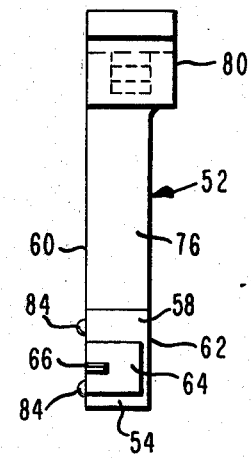
FIG. 6 is a detailed side view of the other latch member of the invention.

With particular reference to FIGS. 1, 5 and 6, the insertable latch members of the invention are described below. Left and right side insertable latch members 50 and 52 are provided. The right side latch member 52 is the mirror image of the left side latch member 50. The left side latch member 50 is illustrated in FIG. 5. The latch member 50 comprises a rectangular base 54 having sides 56, 58, 60 and 62. The base 54 is inserted in cavity 28 in the header 10. Side 60 of base 54 is flush with face 26 when inserted in cavity 28 of the header 10. Side 62 of base 54 of each latch member engages with recessed surface 32 of each cavity 28. A rectangular key or member 64 extends from side 58 of base 54 and mates with channel or key way 38 in wall 36 of cavity 28. A protuberance 66 extends along a side of member 64. The protuberance provides an interference fit between channel 38 and wall 34 and retains the base 54 in the cavity 28. The end 29 of cavity 28 may be closed, as illustrated, or open.

A tapered elongated latch arm 68 extends from base 54. Side 70 of latch arm 68 is inclined at an included angle 71 of slightly less than 180°, e.g. 178°, with side 56 of base 54 of latch member 50 to insure the latch surface 72 fully engages a mating surface on a connector block. A latch surface 72 perpendicular to side 70 is provided at the free end 74 of 74 of latch arm 68 for engaging a connector block inserted in cavity 28 of header 10. Inclined side 76 of latch arm 68 of latch member 50 extends from base 54 and the latch arm 68 tapers toward the free end 74 of arm 68. A cam surface 78 opposite latch surface 72 provides for opening of the tapered latch arms 68 when a connector block is inserted in the header. Latch release members 80 extend obliquely from the free end 74 of latch arms 68. Release members 80 have serrated or fluted surfaces for facilitating manual release of the latch arms 68 for removal of a connector block. Protuberances 84 on side 60 of base 54 provide clearance between arms 68 and the surface 92 of the circuit board. Inclined walls 24 prevent over-flexing of arms 68 by engaging surface 76 when arms 68 are spread.

Figure 7:
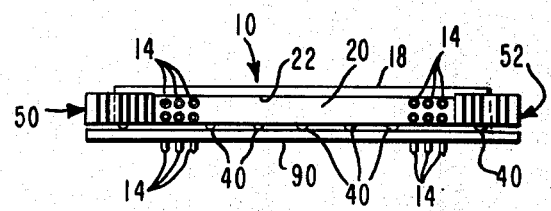
FIG. 7 is a view of a circuit board including a header and latch members according to the invention.

A header 10 including insertable latch members 50 and 52 mounted on a circuit board 90 with the protuberances 40 on face 26 of the header 10 and protuberances 84 on sides 60 of each base member 54 engaging the surface 92 of the board 90 is illustrated in FIG. 7.

The header of the invention may be formed of any suitable insulative material. Although not essential, the latch members according to the invention are preferably formed of similar insulative material.

In the preferred embodiment of the invention, a right angle header, as illustrated, is particularly useful for mounting on a side of a circuit board along an edge of the board, however, it is readily apparent a straight-through header is equally useful.

While the above description and attached drawings illustrate a preferred embodiment of the header and latch members of the present invention, it is apparent that other embodiments and modifications are equivalent and will be obvious to one skilled in the art, and the invention is not to be limited except by the appended claims.

What is claimed is:

1. A header for mounting on a circuit board for removably receiving a connector block having a plurality of electrical connectors mounted therein comprising a block member having a plurality of mating electrical connectors therein for mating with connectors on the connector block and a generally rectangular housing, said block member and said housing being unitary and having a coplanar face for mounting against a surface of a circuit board, said face having a cavity opening onto said face at each end of said block member, each cavity having a common wall with an end of said block member, a recessed surface spaced inwardly from said face, and a second wall spaced from and opposite said common wall, said second wall having a rectangular channel extending therein from said face.

2. A header, as recited in claim 1, wherein said rectangular housing for receiving a connector block includes a pair of inclined side walls, each side wall adjoining the wall of the cavity spaced from and opposite said common wall.

3. A header, as recited in claim 1, said face including a plurality of protuberances for engaging against a surface of a circuit board.

4. A header for mounting on a circuit board for removably receiving a connector block having a plurality of electrical connectors mounted therein comprising a block member having a plurality of mating electrical connectors mounted therein and a generally rectangular housing, said block member and said housing being unitary and having a coplanar face for mounting against a surface of a circuit board, said face having a cavity opening onto said face on each end of said block member, each cavity having a common wall with the end of said block member, a recessed surface spaced inwardly from said face and a second wall spaced from and opposite said common wall, said second wall having a rectangular channel extending therein; and a pair of latch members, each latch member including a base having a rectangular member on one side thereof and inserted in each cavity at each end of the block member with said rectangular member in each rectangular channel in said cavity and an elongated, tapered latch arm extending from said base having a latch surface extending from a side of said latch arm extending from said base.

5. A header, as recited in claim 4, said latch arm additionally comprising a latch release member extending at an oblique angle from a side of said latch arm opposite said latch surface.

6. A header, as recited in claim 5, said latch member including a serrated latch release surface.

7. A header, as recited in claim 4, said rectangular member extending from said base additionally comprising a protuberance extending along a side thereof for providing an interference fit.

8. A header, as recited in claim 4, wherein one of said pair of latch members is the mirror image of said other latch member.

9. A header, as recited in claim 4, including a side of said base being flush with said face and including at least one protuberance extending from said side for engaging a surface of a circuit board.

10. A header, as recited in claim 4, said rectangular housing having a cavity for receiving a connector block including a pair of inclined side walls, each side wall adjoining said cavity wall spaced from and opposite said common wall, and each elongated latch arm extending beyond each inclined wall.

* * * * *